United States Patent [19]

Gooch

[11] Patent Number: 4,985,795

[45] Date of Patent: Jan. 15, 1991

[54] METHOD AND APPARATUS USING A STATIONARY MAGNETIC BODY FOR EFFECTING SIGNAL TRANSFERS BETWEEN A MOVING MAGNETIC CORE AND A MAGNETIC STORAGE MEDIUM

[75] Inventor: Beverley R. Gooch, Sunnyvale, Calif.

[73] Assignee: Ampex Corporation, Redwood City, Calif.

[21] Appl. No.: 128,115

[22] Filed: Aug. 6, 1987

Related U.S. Application Data

[63] Continuation-in-part of Ser. No. 843,453, Mar. 24, 1986, Ser. No. 829,592, Feb. 13, 1986, Ser. No. 715,211, Mar. 22, 1985, abandoned, Ser. No. 808,588, Dec. 13, 1985, abandoned, and Ser. No. 808,924, Dec. 13, 1985, abandoned, said Ser. No. 715,211, is a continuation-in-part of Ser. No. 641,817, Aug. 16, 1984, abandoned, said Ser. No. 829,592, is a continuation-in-part of Ser. No. 641,817, , said Ser. No. 843,453, is a continuation-in-part of Ser. No. 829,592, , Ser. No. 715,211, , Ser. No. 808,568, , and Ser. No. 808,924.

[30] Foreign Application Priority Data

Dec. 15, 1986 [WO] PCT Int'l Appl. .................. PCT/US86/02734

[51] Int. Cl.⁵ .................. G11B 5/187; G11B 5/23; G11B 5/52; G11B 5/127

[52] U.S. Cl. .................. 360/115; 360/84; 360/107; 360/119; 360/122; 360/125

[58] Field of Search .............. 360/115, 119, 120, 122, 360/125, 84, 107

[56] References Cited

U.S. PATENT DOCUMENTS 3,084,227 4/1963 Peters .................. 360/115
3,106,617 10/1963 Fox .................. 360/122
3,391,254 7/1968 Honig .................. 360/115

Primary Examiner—Robert S. Tupper
Attorney, Agent, or Firm—C. Michael Zimmerman; James A. LaBarre; Ralph L. Mossino

[57] ABSTRACT

Magnetic transducer-keeper combination embodiments of the invention are described. Each has a magnetic core defining a physical gap and a thin magnetic keeper arranged in close proximity of the core to bridge the gap. A magnetic flux from the gap saturates the keeper in an area bridging the gap, thereby forming a signal transducing zone in the keeper. The keeper is maintained stationary and the core moved or scanned with respect to the same, thereby moving or scanning the transducing zone in the keeper.

49 Claims, 7 Drawing Sheets

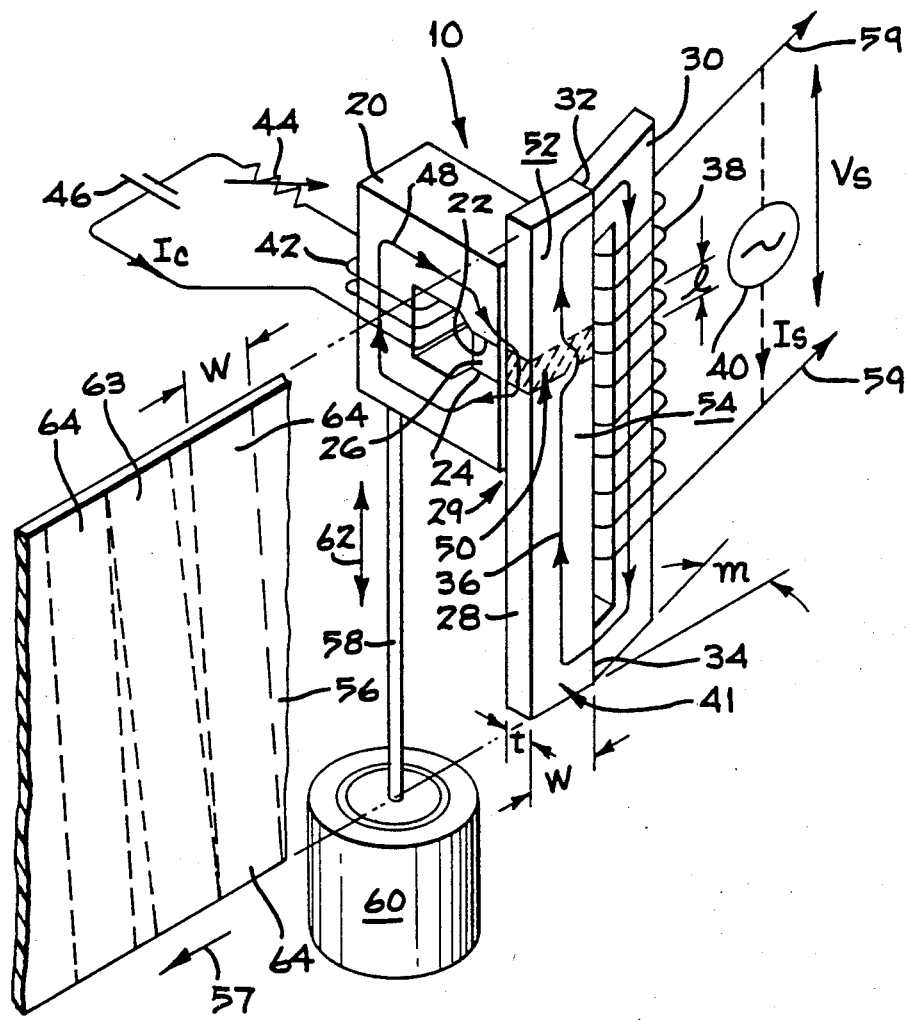
FIG_1

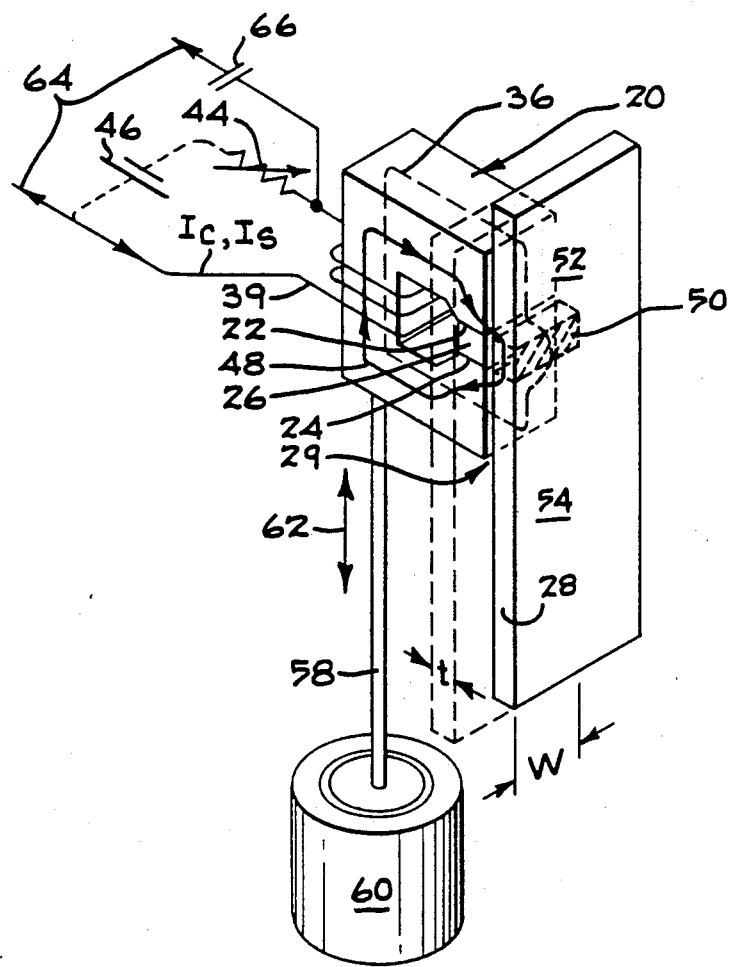
FIG_2A

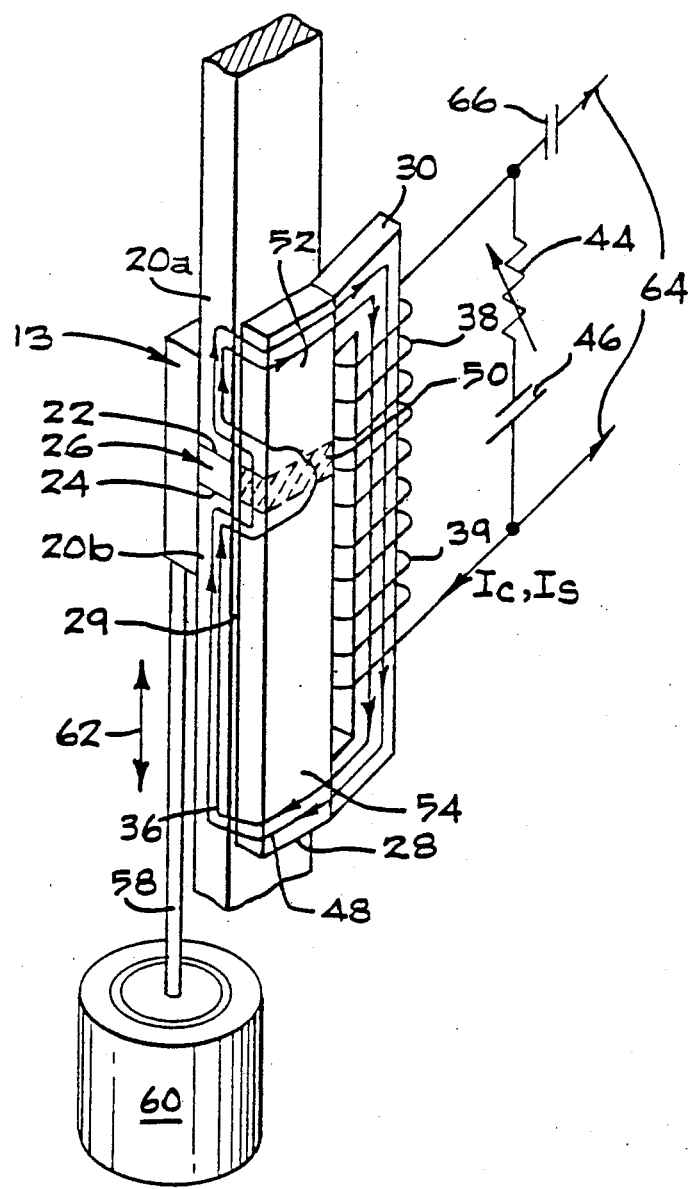
FIG_2B

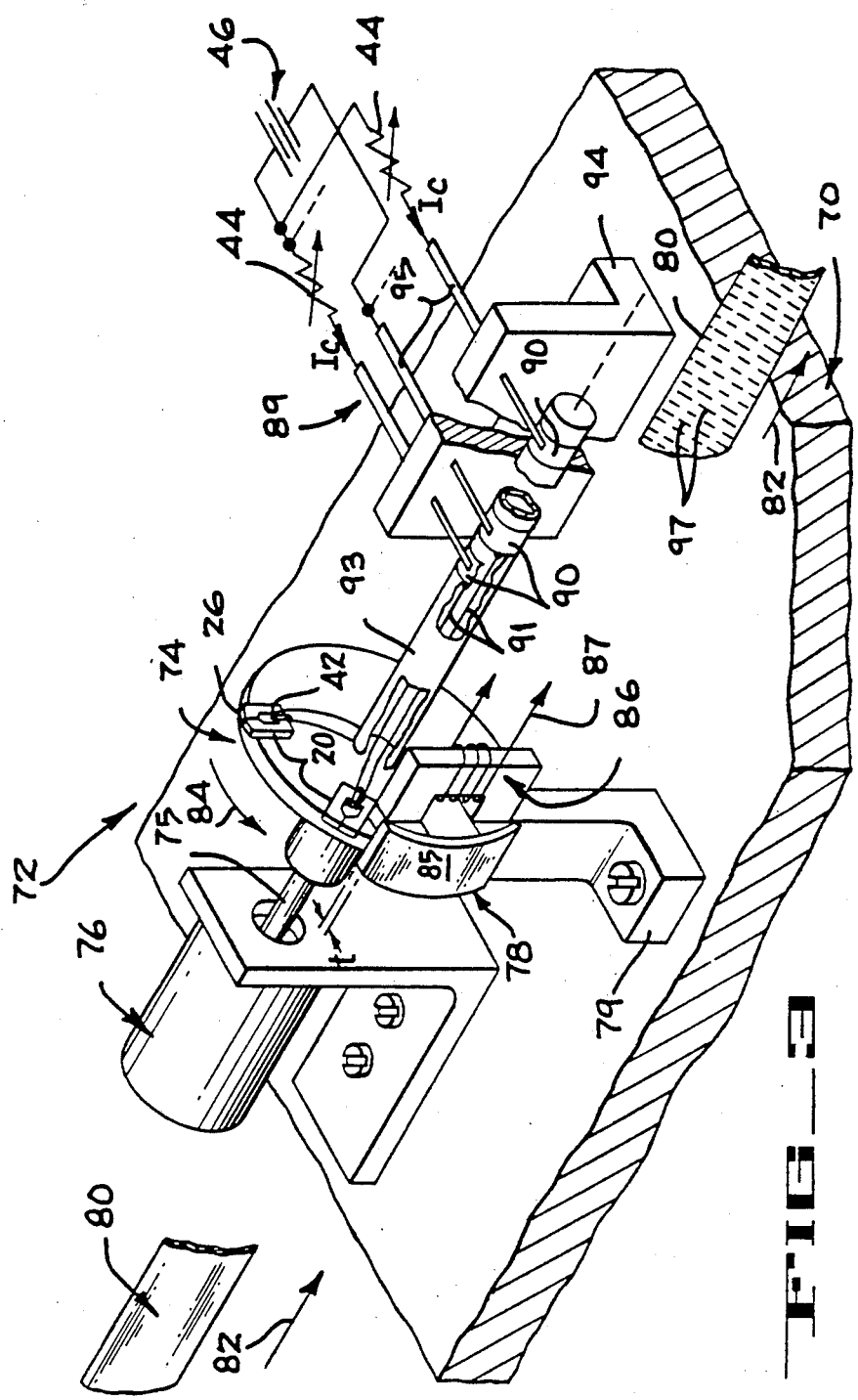

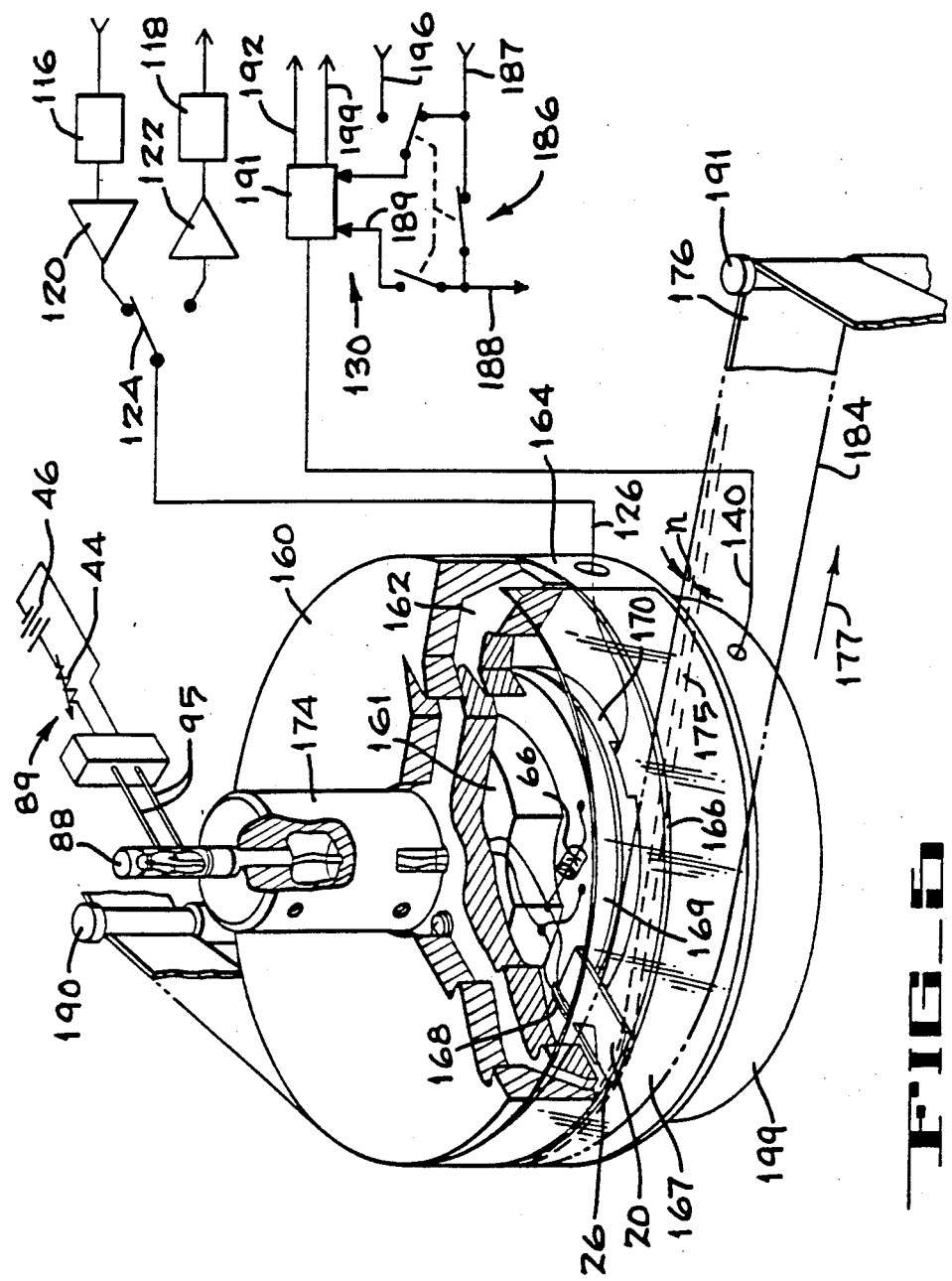
FIG_5

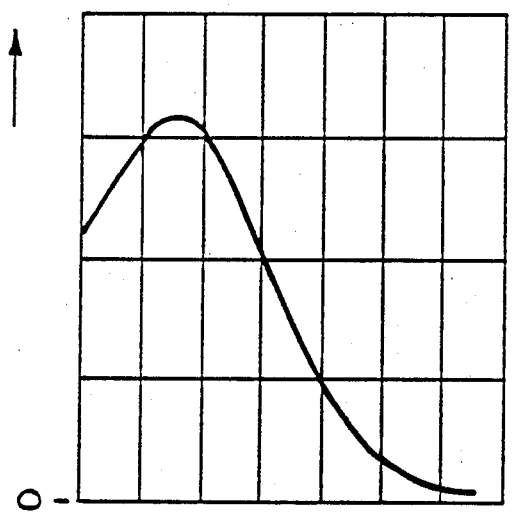
FIG_6
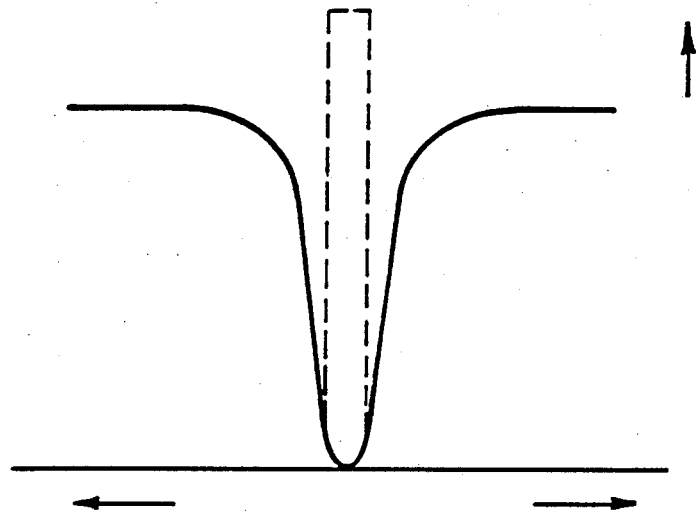
FIG_7

METHOD AND APPARATUS USING A STATIONARY MAGNETIC BODY FOR EFFECTING SIGNAL TRANSFERS BETWEEN A MOVING MAGNETIC CORE AND A MAGNETIC STORAGE MEDIUM

This is a continuation-in-part of my following co-pending U.S. patent application Ser. No. 808,924 filed Dec. 13, 1985 and entitled MAGNETIC TRANSDUCER HAVING SATURABLE KEEPER AND A RECORDING/REPRODUCING APPARATUS UTILIZING THE TRANSDUCER now abandoned; Ser. No. 06/808,588 filed Dec. 13, 1985 and entitled METHOD AND APPARATUS FOR MAGNETIC TRANSDUCING now abandoned; Ser. No. 06/715,211 filed Mar. 22, 1985 and entitled IMPROVEMENTS TO MAGNETICALLY CONTROLLED SCANNING HEADS now abandoned; Ser. No. 06/829,592 filed Feb. 13, 1986 entitled ELECTROMAGNETICALLY CONTROLLED SCANNING MAGNETIC TRANSDUCER; and Ser. No. 06/843,453 filed Mar. 24, 1986 entitled MAGNETICALLY CONTROLLED SCANNING MAGNETIC HEAD TRACKING CONTROL SYSTEM. U.S. patent application Ser. No. 06/808,588 in turn is a continuation-in-part of U.S. patent application Ser. No. 06/715,211. U.S. patent application Ser. Nos. 06/715,211 and 06/829,592 are themselves continuation-in-parts of U.S. patent application Ser. No. 06/641,817 filed Aug. 16, 1984 now abandoned. U.S. patent application Ser. No. 06/843,453 is a continuation-in-part of the following U.S. patent application Ser. Nos. 06/829,592; 06/715,211; 06/808,588; and 06/808,924.

Cross-reference is hereby made to the following U.S. patent applications: U.S. application Ser. No. 100,816 filed Aug. 6, 1987 based upon and entitled to the benefit of the effective filing date of Patent Cooperation Treaty Application No. PCT U.S. 86/02732, entitled MAGNETIC RECORD MEDIUM HAVING DISCRETE MAGNETIC STORAGE AND SATURABLE LAYERS AND MAGNETIC SIGNAL PROCESSING APPARATUS AND METHOD USING THE MEDIUM filed concurrently herewith; and U.S. National application Ser. No. 085,676, filed Aug. 6, 1987, based upon and entitled to the benefit of the effective filing date of Patent Cooperation Treaty Application No. PCT/U.S. 86/02733, entitled METHOD AND APPARATUS FOR MAGNETIC TRANSDUCING filed concurrently herewith. Application Ser. No. 100,816 is now abandoned in favor of continuation application Ser. No. 555,811 filed July 23, 1990.

All of the above-identified patent applications are assigned to Ampex Corporation, assignee of this patent application.

This invention relates in general to magnetic recording and reproducing and, more particularly, to the provision of a body of magnetic material to provide a transducing zone for the transference of magnetically defined information between a signal utilization device and a magnetic storage medium. It more specifically relates to the mechanical control of the location of a transducing zone in such an additional body of magnetic material. (By "transducing zone" as used herein, is meant a zone responsible for coupling magnetic flux to or from the body having the zone). The preferred embodiments of the invention described here relate to the use of the physical gap of a magnetic transducer core to establish a transducing zone in a magnetically saturable body proximate the physical path of a magnetic storage medium, and the movement of the zone in the body by movement of such core.

There are many instances in which it is desirable to transfer magnetically defined information between a magnetic storage medium and a signal utilization device using an electromagnetic transducer which converts the magnetic state definition of the information into an electrical definition of the same. An electromagnetic transducer typically has a body of high permeability magnetic material that is provided with a physical gap (generally referred to as a transducing gap) between two magnetic poles. This gap interrupts the flux path within the body of magnetic material to permit coupling of flux from and to the flux path therein. Flux is coupled from the flux path within the transducer to, for example, a magnetic storage medium by fringing from the body of magnetic material at the gap. The gap also enables the head to "pick-up" (detect) magnetic flux which fringes from a properly positioned magnetic storage medium. Signal means are provided to sense the picked-up flux flowing in the flux path and transmit the information defined by the magnetic flux to a desired signal utilization device. The signal means typically is an electrical coil positioned to detect changes in the flux threading the flux path and convert the magnetically defined information to a corresponding electrical signal. (It will be appreciated that although this detection is transfer of information in one direction, i.e., from a magnetic medium to a magnetic transducer or head, transfer in the other direction, i.e., from a magnetic head to a corresponding magnetic storage medium, is, broadly speaking, quite similar. The information is converted from an electrical signal manifestation to a magnetic state manifestation by passing an electrical signal defining the same through the coil which induces corresponding magnetic flux on the flux path within the head.)

The above technology is used in disc recorders that have rigid magnetic disc storage media. The electromagnetic transducer of such an arrangement is made to "fly" (be out-of-media contact) during a record/-playback operation. The resulting space between the head and magnetic storage medium gives rise to the well-known wavelength dependent spacing losses. Moreover, the resulting space also adversely affects the efficiency of flux transfer therebetween.

In other data recorders, such as magnetic tape or flexible (or floppy) disc recorders, using the technology, the magnetic head is usually in contact with the medium during signal transfer operations. While spacing loss is not such a major problem in these recorders, head and medium wear can be significant in view of relative movement between the medium and contacting head. For example, in wideband magnetic signal recording/reproducing devices, a high relative transducer-to-storage medium speed is necessary for recording/reproducing high frequency signals with good quality resolution. In such devices, the heads and storage medium frequently wear out and must be replaced. In this connection, wear at the face of a head can be particularly deleterious.

Rotary scan magnetic tape recorders represent a significant development in increasing the relative head-to-tape speed. Here, the transducer rotates at high speed in contact with a relatively slowly advancing magnetic tape. The transducer typically is mounted for such rotation on a rotating carrying element, such as a drum. There are two basic types of rotary scan recorders in common use, generally referred to as transverse and helical scan recorders, distinguished by the angle at which the transducer sweeps the tape. There are many problems associated with obtaining a desired accuracy and reproducibility of a signal recorded by rotary scan recorders. For instance, it is necessary to maintain very small mechanical tolerances between and at the rotating transducer carrying element, the transducer structure and the location of the transducer on the carrying element. At the same time, it is necessary to accurately maintain the rotational speed of the transducer, hence, carrying element with respect to the speed at which the tape is transported past the rotating transducer.

As will become more apparent from the following, the method and apparatus of the present invention is applicable to a wide variety of arrangements for transferring information definable by magnetic flux in a magnetic transducer and in a magnetic storage medium. Utilization of the same can provide reduction of transducer and medium wear, reduction of wavelength dependent spacing losses and/or enhancement of transducer efficiency.

The present invention grew out of several discoveries. For one, it was discovered that a transducing zone can be created within a body of magnetic material without the requirement of a physical gap. It further was found that if this body of magnetic material was located to be magnetically proximate a magnetic storage medium such transducing zone can be made responsible for the coupling of flux between the body and a magnetic storage medium. Moreover, it was found that the body can be used to couple magnetic flux on a flux path therewithin to another magnetic body, such as the core of an electromagnetic transducer. It further was discovered that the physical gap in the core of a conventional magnetic transducer can be used, as will be described, to establish the transducing zone in the body. It also was found that movement of such a core or other magnetic material providing the bias flux for the transducing zone will result in the location of such transducing zone correspondingly being moved. (As used herein, the phrase "magnetically proximate" means that the body of magnetic material is positioned relative to the proximate object or field so that flux coupling between the two occurs, assuming that saturation or some similar magnetic affect does not prevent coupling.)

Bodies of soft magnetic material are commonly placed over the ends of a permanent magnet to capture and provide a path for flux between the magnetic poles of the magnet. Such bodies are referred to as "keepers", and serve to protect permanent magnets against being demagnetized. The magnetic material typically used to make a core for a transducer has characteristics similar to those of a keeper. The body of magnetic material utilized in connection with the instant invention basically has the same characteristics as a keeper. In some embodiments of the present invention the body performs a keeper function as well as provides a transducing zone. For these reasons, the body of magnetic material of the invention is sometimes referred to herein as a "keeper". It is preferred that the material of this body have high absolute permeability, low coercivity and low magnetic saturation density. Such a material is commonly designated a soft magnetic material and is to be contrasted with "hard" magnetic materials, i.e., materials having a high coercivity and magnetic saturation density such as those that magnetically store information.

The discoveries responsible for the efficacy of a keeper and the recording/reproducing arrangements based on the same represent major advances in the art. This is particularly true with respect to the simplicity of varying the location or, in other words, scanning the location of the transducing zone within a keeper. It is desirable to be able to utilize such major advance for scanning without the necessity of significant redesign of many existing recorder/playback apparatuses. In accordance with the invention, it has been found that such major redesign can be circumvented in many instances if the scanning of the transducing zone in a keeper is accomplished simply by correspondingly moving the magnetic transducer or other body of magnetic material responsible for establishing the transducing zone in the keeper body.

The transducing zone is formed in the keeper by creating in the same one or more significant magnetic discontinuities, i.e., areas of substantially different magnetic permeability, such as typically are provided in electromagnetic transducers by the inclusion of a physical transducing gap. A permeability gradient provides such discontinuity, and it is most desirable that there be a steep permeability gradient between the adjacent regions of the body providing the transducing zone. The nature of such gradient and a preferred manner of achieving the same will be described in more detail hereinafter. Such discontinuity is most simply provided in the body by having adjacent magnetically saturated and unsaturated regions. Moreover, a transducing zone can be easily generated and defined in the keeper through the cooperation of a physical gap in a conventional magnetic transducer and a source of magnetic bias flux. This source of bias flux can be associated solely with the transducer or solely associated with the keeper and, in some instances, associated with both of the same. Moreover the source of bias flux simply can be provided by the record signal flux passing through the keeper. However it is formed, the location, size and shape of the transducing zone within the keeper is varied by mechanically moving the magnetic material responsible for the same relative to such keeper while at the same time maintaining such body or source magnetically proximate such keeper.

It should be noted that the existence of the transducing zone can be transitory. That is, it is only important that there be a transducing zone at the time which it is necessary for the coupling of flux between the storage medium and the keeper. For example, if the transducing zone is provided by flux induced by an A.C. current, the flux discontinuity responsible for the formation of the transducing zone will be cyclic in nature. If the transfer is from a magnetic storage medium, it is only necessary from a practical matter that the transducing zone be in existence when the recorded magnetic states to be detected are in coupling relation to the transducing zone. When changes in magnetic state which are closely spaced in time relative to one another are to be detected and the transducing zone is provided by flux induced by an A.C. current, it is desirable that the flux responsible for the transducing zone be induced by a current providing very fast transitions, such as can be obtained with a square wave form as opposed to a sinewave form. Moreover, in certain situations it may be desirable to control the coupling of flux between a transducer and a storage medium by controlling the existence in the keeper of the transducing zone. This can be achieved by switching on and off the flux that provides the transducing zone.

Thickness of the keeper is important in determining the performance of the keeper. The selection of the thickness of the keeper depends on its purpose and its location. For reproduce operations, for example, a well defined transducing zone is preferred, and for short wavelength signals, one having a short length. Relatively thin keepers are best for such operations. In applications where head and medium wear avoidance is important, such as in contact record and/or reproduce devices, a thicker keeper is preferred. Moreover, the transducer-keeper-magnetic storage medium arrangement also can influence the keeper thickness. In any case, the thickness of the keeper is selected relative to potential flux therein to create the transducing zone at the locations desired. For example, in arrangements in which the keeper engages the face of a magnetic core having a physical gap so as to physically bridge such gap and a predominant amount of the bias flux flows in the head as well as in the keeper, the keeper is selected to be thin with respect to the core adjacent the gap, and the keeper-core cross-sectional area perpendicular to the bias flux path adjacent the gap is selected to be large, so the portion of the keeper which bridges the physical gap will have a high flux density, preferably one which saturates the region having the same. The permeability of the saturated regions is low, i.e., similar to nonmagnetic materials, while the permeability of the surrounding regions remains high. These regions cooperate to define a transducing zone within the body.

In preferred embodiments described here, the bias flux which defines the transducing zone in the keeper is flux which emanates from a conventional transducer arrangement having a physical gap. The magnitude of the responsible bias flux is selected to establish adjacent regions of different permeabilities at a selected area of the keeper bridging the face of the transducer that includes the physical gap. These regions cooperate to define a zone in the keeper in the nature of a "virtual gap". This magnetically formed virtual gap or transducing zone is utilized for signal recording and playback. The transducing zone extends in a direction through the keeper defined by a line extending at the physical gap between the magnetic transducer and the magnetic storage medium. Moreover, the shape or size of the transducing zone in the keeper is controllable by appropriately controlling the shape and size of the boundary within the keeper between regions of significantly different permeabilities, e.g., between unsaturated and saturated portions of the keeper.

It will be further appreciated that the method and apparatus of the present invention can have the unique feature of not only providing a moving magnetically formed transducing zone in a body having no physical gap, but also shunting undesirable flux that ordinarily fringes from the physical gap in a transducer or from recordings in the magnetic storage medium, which may otherwise deleteriously affect desired magnetic state storage or flux transfer.

Copending patent application Ser. No. 06/808,921, describes a magnetic medium which has a thin, high permeable magnetic keeper layer as well as a magnetic storage layer for storing information signals. As brought out in such application, it is known to provide magnetic record media for perpendicular magnetic recording and storage having a layer of a highly permeable, unsaturable magnetic material in addition to a layer of hard magnetic material for storage. The main purpose of providing such highly permeable layers of magnetic material in perpendicular magnetic record media has been to form an undefined, highly permeable flux path for signal recording and reproduction flux. These layers have not provided a defined transducing zone for effecting signal transfers between transducers and media, much less a moving one, nor have means been provided to create the conditions in layers necessary for the formation of such a moving transducing zone. Moreover, these layers have been intentionally designed to be unsaturable by being made thick relative to the expected flux density, and have no effect on spacing and reproduce gap losses, nor wear of magnetic transducers and magnetic record media, all being features characterizing the method and apparatus of the present invention.

Most desirably, in the preferred embodiments of the present invention the keeper is maintained stationary with respect to a relatively slow moving magnetic storage medium, such as a layer of an appropriately magnetic storage material on a flexible substrate providing, in essence, a magnetic tape. The transducing zone in the keeper is formed by flux directed into the keeper by a magnetic core associated with a magnetic transducer. Such core is moved at a relatively high speed by mechanical means with respect to the stationary keeper to correspondingly move the transducing zone. The magnetic storage medium may be maintained in contact with the keeper and moved relatively slowly with respect to the same. Thus, having the keeper provide the gap-less transducing zone results in high speed movement of a transducing zone without the necessity of such medium physically contacting the gap face of a high speed transducer core. As a result, life shortening wear of the magnetic core of the transducer is eliminated. Moreover, the contact between the keeper and magnetic storage medium serves to reduce the effects of wavelength dependent spacing losses and improve the efficiency of the record/reproduce process. On the other hand, a small physical spacing is preferred between the core of the transducer and the keeper. This spacing should be kept at a minimum to reduce reluctance losses in the signal path.

In the following detailed description, the method and apparatus of the present invention will be described with reference to specific embodiments thereof. However, it will be appreciated that the keeper body may be utilized in combination with signal utilization devices and magnetic storage media in general, and therefore the invention is not limited to the described embodiments.

With reference to the accompanying drawings:

FIGS. 1, 2A and 2B are schematic perspective views of embodiments of the invention where the transducer core is providing a reciprocating movement with respect to a stationary keeper;

FIG. 3 is a schematic perspective view of another embodiment of the invention where the transducer core is rotating with respect to a stationary keeper;

FIG. 5 is a schematic perspective view of an apparatus utilizing the transducer-keeper combination of the invention for recording on and/or reproducing from tracks established on a magnetic record medium transported along a helical path;

FIG. 6 is an example of a flux density versus permeability characteristic of a well known magnetic material; and FIG. 7 shows flux density versus permeability characteristic across the length of a transducing zone established in the differentially permeable layer of an embodiment of the present invention.

Figure 4:
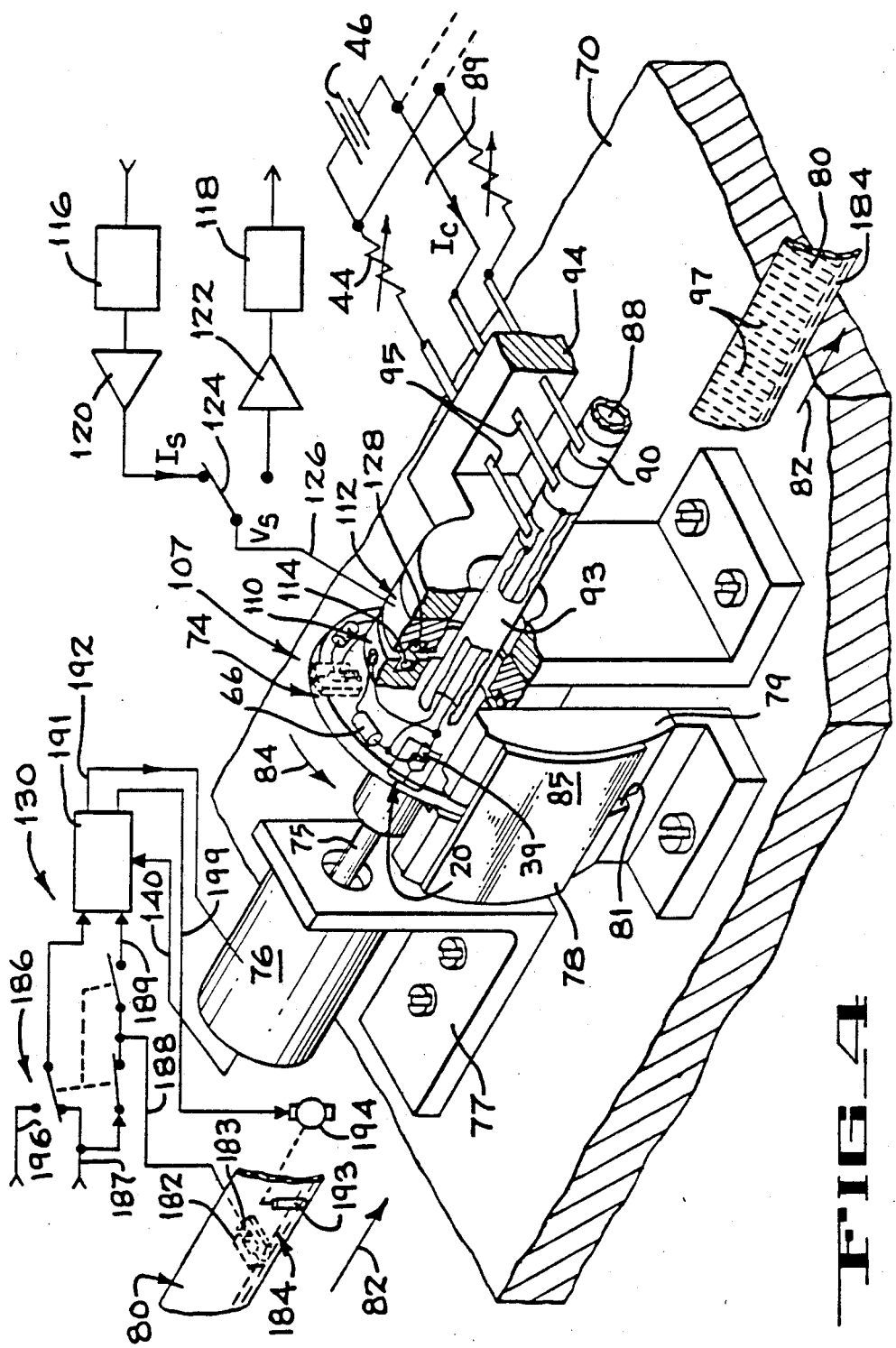
FIG. 4 is a schematic perspective view of an apparatus utilizing the transducer-keeper combination of the invention for recording on and/or reproducing from transverse tracks along a magnetic record medium.

In the following description and drawings, like elements will be designated by like reference numerals to facilitate comparison between various embodiments. The description of similar elements and circuit portions illustrated in more than one figure of the drawings may not be repeated with reference to each of the figures.

Embodiments in accordance with the present invention will be described now with reference to the FIGS. 1–7 that have a body 20 of magnetic material having characteristics like those used to fabricate magnetic transducers, commonly referred to as a core, defining a pair of magnetic poles 22, 24 that form therebetween in accordance with conventional practice, a physical gap 26 of the type used to cause magnetic signal transfers. This body or core 20 is mounted for movement relative to a stationary body 28 of magnetic material, preferably having the characteristics of a keeper, which does not have a physical gap. The keeper 28 defines a transducing zone 50 within it that follows the movement of the core 20, if the physical gap 26 defined by the core is responsible for the formation of the transducing zone. With further reference to FIG. 1 there is shown schematically a magnetic transducer 10 formed by the core 20, made of a suitable magnetic material, for example ferrite. A nonmagnetic material, for example glass or silicon dioxide is provided between the poles 22, 24 to obtain a well defined physical gap 26 of the type typically used and referred to as a transducing gap. The transducer core 20, poles 22, 24 and gap 26 may be constructed by well known magnetic head fabrication methods, and therefore a detailed description thereof is not provided.

An elongated keeper 28 of a thin, soft magnetic material, for example permalloy, having characteristics as described hereinbefore, is arranged adjacent to the poles 22, 24 to bridge gap 26. In this embodiment, the transducer core 20 and keeper 28 are maintained in a closely spaced relationship, with no physical contact between these two elements, as illustrated by a spacing 29. As will be appreciated from the following description, the spacing prevents objectionable wear of the transducer 10 as it is moved relative to the keeper 28. In the presently described embodiment, the width dimension of the gap 26, which corresponds to the width dimension W of the tracks 64 recorded along the magnetic storage medium 56, extends at a right angle to the longitudinal direction 62 of the keeper 28.

The keeper 28 is constructed as a solid, continuous piece or layer of magnetic material with no physical gap in the transducing area. In the embodiment of FIG. 1, the width of the keeper is equal to the width W of the gap 26, but the keeper may be made wider, such as the embodiment illustrated in FIG. 2. The keeper 28 preferably has a very small thickness t in the direction of the gap depth, for example between 0.00025 and 0.002 inch. It may be made in the form of a thin foil or deposited by sputtering in vacuum or plating on a thin substrate such as Mylar or Kepton, manufactured by Dupont Corporation. For example, the substrate may have a thickness between 0.0001 and 0.0005 inch.

In the embodiment of FIG. 1, a body 30 of magnetic material forming a transducing signal core 30 is disposed in magnetic coupling relation with the keeper 28. The core 30 may be made, for example, of magnetic materials commonly used for the fabrication of magnetic transducer cores. The signal core 30 abuts a lateral surface of the keeper 28 at opposite ends 32, 34 thereof to form a closed signal flux path 36 therewith.

A transducing signal winding 38 is wound around the signal core 30. Winding 38 is utilized for converting electrical signals applied to it from an external signal source, schematically shown at 40, into magnetic signals for recording by the transducer-keeper combination on a record medium, such as magnetic tape 56. In addition, winding 38 is utilized for converting signals recorded on the magnetic tape 56 and picked up by the transducer-keeper combination into electrical signals, as will be described further in more detail hereinafter. To better distinguish between the signal core 30 and transducer core 20, core 20 will be hereinafter referred to as the rear core, and core 30 as the front core. The front core 30 is preferably arranged at an angle, m, sloping away from a front surface 41 of the keeper 28, which faces the record medium 56, to avoid contact with the medium. A bias control winding 42 is wound around the rear core 20 and a control current $I_c$ is applied thereto by a variable current source, including variable resistor 44 and a D.C. control voltage source 46. Alternatively, an adjustable A.C. control current source may be utilized in this embodiment in place of the D.C. source.

When no control current is applied to the bias control winding 42, the keeper 28 magnetically shunts the gap 26 and no signal transfers with the record medium 56 take place. However, when a control current $I_c$ is applied from source 46 to the control winding 42, that current induces a control flux 48 in the rear core 20. The control flux 48 is coupled by the gap 26 into the closely spaced thin keeper 28 magnetically bridging the gap 26. The keeper thus serves as a return path to the rear core 20 for the bias control flux 48.

Because of the very small cross sectional area of the keeper 28 in a direction perpendicular to the control flux path 48 bridging gap 26, the fringing flux from the gap 26 locally saturates the keeper 28 in a region 50 which bridges the gap 26, as is shown by a hatched area. This establishes a low permeability in the region 50 corresponding to that of a non-magnetic material, such as air. The flux density in other areas of the keeper 28 surrounding the saturated region 50 and extending in close proximity over the magnetic core 20 is much lower than in region 50 and therefore these areas do not saturate and remain highly permeable. Consequently, the saturated region 50 is localized between two confronting highly permeable areas 52, 54 of the keeper 28 to provide a "gap-less" transducing zone.

When the region 50 of the keeper 28 is saturated as previously described, a record signal flux 36 extending through the signal core 30 and permeable portions 52, 54 of keeper 28 is coupled by the keeper to intercept the magnetic storage medium or tape 56, when in close proximity of the keeper. For example, in the embodiment of FIG. 1, a tape 56 is slowly advanced in a longitudinal direction 57 past the keeper 28 and in direct contact therewith. When a recording current $I_s$ from signal source 40 is applied to signal winding 38, a recording flux is induced in flux path 36, which extends through the transducing signal core 30 and keeper 28. Because of the adjacent magnetically saturated and unsaturated regions defining the transducing zone 50, the flux is directed thereby along the wavelength independent, low reluctance flux path extending from the magnetically unsaturated areas 52 and 54 of the keeper 28 to the tape 56. Alternatively, when the transducer-keeper combination of FIG. 1 is utilized in playback operations, a signal flux from the tape 56 intercepts the keeper 28 at the transducing zone 50 and it follows the flux path 36 in the keeper 28 and signal core 30 and intercepts the signal winding 38 to produce an output voltage Vs on output lines 59.

The length l and the width W of the saturated region 50 correspond to equivalent dimensions of the physical gap 26 of back core 20. The magnetic characteristics of the keeper are selected such that the bias control flux which is necessary to saturate the region 50 bridging the transducing gap 26 is far below the level that could result in objectionable levels of control flux fringing from the keeper to effect the magnetic state of the medium. The level of bias control flux is primarily a function of the magnetic material of the keeper 28 and of its cross sectional area in the direction perpendicular to the bias control flux path 48. That cross sectional area, on the other hand, is defined by the width W and thickness t of the keeper. For a selected width W, a thicker keeper requires more flux for the saturation of region 50. It is desirable to have the thickness t of the keeper 28 small for the many reasons discussed previously. However, an important reason for keeping dimension t small in the embodiment of FIG. 1 is that the effective transducing zone depth in the direction of t is small, which maintains the reluctance through the saturated transducing zone 50 high, hence, the shunt losses through the transducing zone 50 low. However, in wideband, high density recording and playback devices where the keeper 28 is in contact with the record medium 56, it is also desirable to avoid or minimize life-shortening wear of the keeper. Consequently, selection of the thickness t of the keeper 28 usually involves a compromise between minimizing shunt losses and maximizing the life of the keeper.

The previously mentioned mechanical movement of the rear transducer core 20 with respect to the stationary keeper 28 is obtained in the embodiment of FIG. 1 as follows. The rear core 20 is rigidly attached to one end of a shaft 58, whose other end is attached to a device 60 for providing a reciprocating translational movement in the direction of arrow 62. For example, device 60 may be implemented as an electromagnetic actuator or other well known reciprocating device. It is important to obtain a linear velocity of movement of the gap 26 relative to the keeper 28 to avoid time-varying or non-linear signal transfers during recording and playback operations. In operation, a control current $I_c$ is applied by voltage source 46 to the control winding 42 of a sufficient magnitude to saturate region 50 of the keeper 28. The tape 56 is advanced in the direction of arrow 57 in contact with the keeper 28, as previously described. The rear core 20 is moved by the reciprocating device 60 in the direction of arrow 62, thereby mechanically advancing the physical transducing gap 26 along the keeper 28. As described previously, the location of the saturated region 50 along the keeper 28 in the direction 62 follows the movement of the physical gap 26 along the keeper.

During record operation modes, a recording signal current $I_s$ applied to the signal winding 38 causes a corresponding signal flux 36 to flow through path 36, which is coupled by the transducing zone 50 to effect recording along transverse tracks 63, 64 on the tape 56. One set of parallel tracks, such as 63, is recorded during a movement of the front core 20 in one direction, while a second set of parallel tracks, such as 64, is recorded during movement of the front core in the opposite direction. Either set of tracks 63 or 64 may be eliminated by turning off either the recording current $I_s$ or the bias control current $I_c$ during movement of the core 20 in one of the directions.

The reproduction of signals recorded along parallel transverse tracks of the tape record medium 56 is obtained by the transducer-keeper combination of the embodiment of FIG. 1 in a manner analogous to the recording of signals, that is, by reciprocating the front core 20 in the direction 62, while the transducing zone 50 is moved over recorded tracks on the medium 56. However, instead of applying a record current to the signal winding 38, the transducer-keeper combination functions to detect a playback signal flux emanating from the medium 56, which enters the keeper 28 via the unsaturated regions 52, 54, adjacent to the saturated region 50. The playback signal flux 36 intercepts the signal winding 38 which, in turn, provides to output line 59 a playback voltage Vs for further processing in a conventional manner.

From the foregoing description, it is seen that the transducer-keeper combination of the embodiment of FIG. 1 may provide a recorded track pattern in a direction transverse to a relatively slowly advancing tape 56 by rapidly scanning the transducer rear core 20 along the stationary keeper 28. The tape 56 is in direct contact with the stationary keeper 28, which does not have a physical gap therein. As described hereinbefore, this contact results in the establishment of a flux path between the tape 56 and signal winding 38 that is not wavelength dependent, which reduces the effects of spacing losses. Furthermore, in this embodiment of the invention the need for a rotatable member for carrying the transducer, such as is common in video recorders, is obviated while a relatively high transducer-to-medium scanning speed is obtained. Moreover, no rotary transformers or slip rings are needed to transfer the signal between the transducer and record medium.

As briefly discussed hereinbefore, the control current source 46 can be eliminated for record operations, if sufficient record signal current $I_s$ is provided by source 40 to saturate the region 50 of keeper 28. However, for playback operations, saturation of region 50 requires a bias flux, obtained in the embodiment of FIG. 1 by applying current $I_c$ to the control winding 42.

FIG. 2A illustrates an embodiment of the invention similar to that of FIG. 1, but differing in that the embodiment of FIG. 2A has no front core. In this embodiment, the signal and control windings 38, 42 are combined into a single winding 39 arranged around the rear core 20. The single winding 39 is connected to the previously described bias control current source 46 via resistor 44 to receive the previously described control current $I_c$. In addition, the single winding 39 is also connected to a record or playback amplifier (not shown in FIG. 2A) via lines 64. A series capacitor 66 is connected in line 64 to isolate the bias control current source 46 and signal amplifiers coupled to lines 64. Consequently, both the recording signal flux 36 and the control flux 48 extend in parallel through the core 20 and keeper 28. In record operation modes, where a record current $I_s$ is applied via line 64 of sufficient magnitude to saturate the transducing zone 50 of the keeper 28, the control current source 46 and resistor 44 may be omitted, as represented by interrupted lines coupling the current source and resistor to winding 39. However, in playback applications, saturation of the transducing zone 50 requires a bias flux, such as obtained by applying a control current $I_c$ from source 46 to the single winding 39. In the embodiment of FIG. 2A, an AC control signal source may be utilized instead of the DC source 46. In that event, it is necessary to connect a filter (not shown) in line 64, instead of capacitor 66, for isolating the AC control signal from the information signal being recorded on or played back from the magnetic storage medium.

With respect to the foregoing description, it will be understood that FIGS. 1 and 2A are schematic representations of structures in accordance with the present invention. There are numerous ways in which that basic structure may be implemented. For example, the keeper 28 may have a width greater than the width W of the rear core 20, as shown in FIG. 2A. By extending the width of the keeper 28 beyond one or both sides of the rear core 20, the length l and width W of the saturation region 50 are substantially unchanged and correspond to that of gap 26, as previously described. As a further example, the shaft 58 may be held in a rigid supporting bracket and the rear core 20 moveably mounted thereto by various known suspension systems (not shown). The keeper 28 and transducing signal core 30 may be fixedly supported by such bracket as well. The control winding 42 may be wound around the rear core 20 and move therewith, as in the embodiments of FIGS. 1 and 2A. Alternatively, the control winding 42 may be made stationary, and attached to the bracket, while the rear core 20 is mounted for vertical movement along that winding out of contact therewith. A separate signal winding may also be arranged in this manner. If desired, a plurality of rear cores 20 may be mounted on a common shaft and driven by a common translating device 60. In such arrangement, each core 20 may be associated with a separate stationary keeper and signal winding, while a common stationary control winding may thread all the cores. The thusly obtained transducers may be utilized for synchronous, either sequential or simultaneous, recording and/or playback relative to a plurality of parallel tracks along a record medium.

FIG. 2B illustrates a further emodiment of the transducer-keeper combination of the present invention. In this embodiment, instead of the rear core 20 forming a closed magnetic circuit through the physical gap 26 as in the embodiments of FIGS. 1 and 2A, the gap 26 is formed between two discrete magnetic core members 20a, 20b fabricated from highly permeable magnetic material of low coercivity, such as commonly used to fabricate conventional magnetic heads. As will become more apparent from the following description, each of the cores 20a, 20b has a length about equal to the length of the stationary keeper 28 in the direction of the reciprocating movement of the cores indicated by arrow 62. The members 20a, 20b are held together by a non-magnetic member 13, for example of aluminum, serving as a bracket. The bracket 13 is attached to the rod 58, which in turn is driven by the previously described translating device 60. The device 60 drives the cores 20a, 20 b in a reciprocating movement in the direction of arrows 62, in a similar manner as previously described with reference to the embodiment of FIG. 1. A combined control and signal winding 39 is wound around the front core 30. Consequently, the bias control signal path 48 extends through the front core 30, permeable portions 52, 54 of keeper 28 and magnetic back cores 20a, 20b. The signal flux path 36 is substantially the same as previously described with reference to the embodiment of FIG. 1, but instead of extending through the length of the keeper 28, it extends with the bias flux through the back cores 20a, 20b, as illustrated in FIG. 2B. In operation, the region 50 is saturated by the control flux 48 established by a control current $I_c$ from either a DC or AC control source, as previously described. Because of the length of each of the back cores 20a, 20b, the bias flux established by the control current remains in the cores regardless of the locations of the physical gap 26 along the length of the keeper 28, except at the location of the physical gap. In this manner, the desired saturated transducing zone 50 is established in the keeper 28 opposite the physical gap 26 and follows such gap as the back cores are reciprocated by the translating device 60.

Further embodiments of the present invention will now be described with reference to FIGS. 3 to 5. In these embodiments, the rear core 20 is rotated in close proximity to a stationary keeper. One or more such rear cores are arranged about the periphery of a rotating head wheel, with their portions defining the physical gaps projecting therefrom. The keeper is formed as a thin cylindrical segment, and is disposed in nested relation with the periphery of the rotating wheel. The keeper is maintained stationary and in closely spaced relationship with respect to the rotating cores to bridge the rotating gaps defined by the rear cores, whereby the rotating gaps sweep across the keeper in sequence. The tape is transported in a longitudinal direction past the stationary keeper and preferably in contact therewith. In the embodiments of FIGS. 3 and 4 the physical gap formed in each rear core scans the tape in a transverse direction, while in the embodiment of FIG. 5 the tape is transported in a helical path, as it is scanned by a moving transducing zone established by a transducer rotated relative to the stationary keeper, as will be described hereinafter.

With further reference to FIG. 3, there is shown a base 70 of a nonmagnetic material, for example, aluminum, on which a rotating transducer-stationary keeper assembly 72 is mounted. A head wheel 74 holds one or more rear cores 20, which are similar to those previously described with reference to and shown in FIG. 1. A control winding 42 is wound around each rear core 20. If more than one core 20 is used, they are preferably spaced equally about the circumference of the wheel. The wheel 74 is made of a nonmagnetic material, for example, aluminum, and is fixedly mounted to a motor shaft 75. The shaft 75 and wheel 74 are driven by a motor 76. The motor 76 is held on the base 70 by means of a nonmagnetic bracket 77, for example of aluminum. A keeper 78 of a thin, magnetic material, for example permalloy or another one of the previously described keeper materials, is fixedly attached to the base 70 by means of a nonmagnetic bracket 79, for example of aluminum. The thickness of the keeper 78 is preferably within the range previously described with reference to FIG. 1.

In the embodiment of FIG. 3, the keeper 78 is a cylindrical segment supported concentrically relative to and spaced from the periphery of the rotatably mounted head wheel 74, to obtain a uniform spacing between the rotating physical gaps 26 and the keeper 78. A tape 80 is transported in longitudinal direction indicated by arrow 82 past the keeper 78 and in physical contact with an outer surface 85 thereof. A front core 86 having a signal winding 87 arranged thereon is rigidly mounted to the keeper 78 in a manner similar to that of the embodiment of FIG. 1. The front core 86 preferably has a U-shape with both open ends thereof in physical contact with a lateral surface of the keeper 78 to form a substantially closed magnetic circuit therewith in the manner previously described with reference to the embodiment of FIG. 1.

A slip ring assembly 88 and a brush or wiper assembly 89 are also provided in the embodiment of FIG. 3. The slip ring assembly comprises a rod 93 of insulating material, such as plastic, and a plurality of slip rings 90 disposed along the rod, the assembly firmly attached to the motor shaft 75 to rotate therewith. Each slip ring 90 is connected by means of an electrical conductor 91 to a particular control winding 42 arranged on a particular rear core 20. For example, the slip rings 90 may be gold plated onto the surface of the insulting rod 93.

The brush or wiper assembly comprises a plurality of individual brushes 95 commonly coupled to an adjustable D.C. control voltage source 46. Individual adjustable series resistors 44 are coupled to each brush 95 to permit adjustment of the control current provided to the individual control windings 42. The assembly 89 is rigidly mounted to base 70 by means of an insulating bracket 94, for example of aluminum. Well known and commercially available brush and slip ring assemblies 89, 90 may be utilized to connect the control currents provided by the source 46 to the respective rotating control windings 42. For example, brush block, part number 3751-001, and slip ring assembly, part number 3857-01, both manufactured by Poly-Scientific, Litton Systems Inc., are suitable for use as the brush and slip ring assemblies 89 and 90, respectively. The signal winding 87 is coupled to a record signal circuit or alternatively to a playback signal circuit in the manner that will be described hereinafter.

The operation of the transducing assembly 72 of FIG. 3 will be now described. The principles of the record and playback operation modes utilizing the rotating rear cores and the stationary keeper of FIG. 3 are the same as previously described with reference to the embodiment of FIG. 1. However, instead of the previously described reciprocal movement, the rear cores are rotated in a circular path in one direction relative to the keeper and tape. A more uniform and linear scanning of the record medium is thereby obtained. Synchronization of the rotational speed with respect to the longitudinal tape movement is also facilitated by such movement of the rear cores.

When the above-described rotating transducer-stationary keeper assembly is utilized for signal recording along a longitudinally moving tape 80, a record current is applied to the transducing winding 87 from a conventional record circuit (not shown). Simultaneously, the control current $I_c$ is applied via the brush and slip ring assemblies 88, 89 to the rotating control windings. As each physical gap 26 sequentially rotates past the keeper 78, the flux emanating therefrom saturates a region of the keeper bridging the gap. That saturated region in effect is an extension of the gap 26, as has been described previously with respect to the various transducer-keeper combination embodiments. The flux from the permeable portions of the keeper 78 which surround the saturated region pass into an adjacent medium. Thus, when tape 80 passes the keeper 78 in contact with its outer surface 85, the signal flux from the keeper records a signal along parallel tracks 97 on the tape.

It will be appreciated that in the embodiment of FIG. 3 the mechanically rotating physical gap 26 is out of contact with both the keeper 78 and medium 80. Gap wear and erosion due to transducer-to-medium contact are eliminated. In addition, the wear of the keeper is minimal, because only a respectively slow moving medium in contact with a smooth gap-less surface of a stationary keeper. Tape shedding, characteristic of recorders having a high relative transducer-to-tape speed, is also reduced because of the much lower keeper-to-tape speed.

Signal transfers occur with each track during one pass of one transducer core 20 by the keeper 78. Preferably, the rear cores 20 are spaced around the wheel 74 such that a continuous information signal, i.e., a signal having no interruptions in time, may be transferred between the tape 80 and transducing winding 87 by adjacent rear cores consecutively rotating past the stationary keeper 78. However, signal transfers can be arranged to occur selectively, such as in time-spaced bursts, by switching the bias control current on and off (for record operation modes, the record signal current can be so controlled for this purpose) as the keeper is scanned by the plurality of rotating adjacent rear cores.

With reference to the foregoing description of the transducer-keeper combination embodiment of FIG. 2B, it will be understood that it may be utilized in the apparatus of FIG. 3 by attaching the rear cores 20a, 20b of the embodiment of FIG. 2B to the rotating wheel 74.

FIG. 4 illustrates a schematic diagram of a wideband, high density recording and reproducing apparatus utilizing a rotating transducer-stationary keeper assembly 107, similar to the assembly 72 of the embodiment of FIG. 3. Here, the keeper 78 is attached to a nonmagnetic supporting bracket 79, for example by epoxy. A slot 81 is provided in the bracket 79 to allow the head wheel 74 to rotate in close proximity to the keeper 78. The transducer-keeper combinations in this embodiment differ from those of FIG. 3 in that a single winding 39 is wound around the rear core 20 and is coupled to receive both the signal current and bias control current. Thus, the rear core 20 serves to provide control and signal flux paths, as has been described previously with respect to the embodiment of FIG. 2A, and a front core is not needed in the embodiment of FIG. 4. In the apparatus of FIG. 4, the control current $I_c$ as well as the recording current $I_s$ or playback voltage $V_s$ are coupled to the windings 39 of the rotating rear cores 20 by means of rotating coupling elements, such as the slip ring and brush assemblies 88, 89 previously described with reference to the embodiment of FIG. 3. The recording signal current or playback voltage are coupled to the windings 39 via a rotary transformer assembly, having a primary portion 110 and a secondary portion 112. The primary portion 110 is rigidly attached together with the head wheel 74 to the rotating motor shaft 75 and rotates therewith. There is one rotating primary transformer portion 110 for each rear core 20. Each primary transformer portion 110 has a primary winding 114 attached to one winding 39. A capacitor 66 is coupled between the winding 39 and primary winding 114 to isolate the signal processing circuits from the D.C. bias control circuits.

The apparatus of FIG. 4 includes a record signal processor 116 and a playback signal processor 118, for processing a signal prior to transfers between them and the tape 80. The apparatus of FIG. 4 may be utilized for high density recording and playback of television signals or other high frequency, wideband signals along tracks 97 extending transversely across a longitudinally moving tape. A switch 124 is shown for selecting a record or playback operation mode. During a record mode of operation, the record current $I_s$ is coupled from the record amplifier 120 to a secondary winding 128 of the transformer via switch 124 and line 126. During a playback mode of operation, the line 126 and switch 124 connect a playback voltage Vs from the secondary winding 128 to the playback amplifier 122. Record and playback signal processors 116, 118 and amplifiers 120, 122 employed in the art of recording and reproducing wideband signals, such as television signals may be employed in the apparatus of FIG. 4. Therefore, a detailed description thereof will not be given.

Moreover, for the apparatus of FIG. 4, tape transport mechanisms (not shown) of the kind employed in known rotary head transverse scan tape record and reproduce apparatus for television signal applications can be utilized to transport the tape 80 in a longitudinal direction 82 in contact with an outer surface 85 of the keeper 78. Furthermore, less complex tape transport mechanisms utilized in known audio tape record and repoduce apparatus may be employed as well.

A servo system 130 is provided for coordinating the rotation of the head wheel drive motor 76 with the longitudinal transport of the tape 80. During record position modes, the servo system 130 functions to coordinate the rotation of the head wheel 74, hence, the scanning rate of the transducing zone in the keeper 78, and speed of transport of the tape 80 so that the recorded tracks 97 are uniformally distributed along the tape transversely at a precise angle relative to the tape's longitudinal direction. In addition a track 184 of control signal is recorded in the longitudinal direction 82 on tape 80 by a stationary transducer 182 to facilitate during reproduction coordination of the scanning of the transducing zone 29b and transport of the tape 80. During reproduction, the transducer 182 is utilized to reproduce the recorded control signal from track 184 in a manner well known in the art and is employed to synchronize the transport of the tape 180 with the rotation of the head wheel 74, hence, scanning of the transducing zone in the keeper 78. A multiple pole switch 186 connects the winding 183 of transducer 182 and a servo circuit 191 with an input line 187 when in the position indicated during a record operation mode. When in the other position indicated, the switch 186 connects the winding 183 with the servo circuit 191 and disconnects the input line 187, hence, control signal from the servo circuit and transducer 182. In place of the control signal, switch 186 couples a reproduce or play reference signal received on line 196 to the servo circuit 191 for use in a mannner that will be described further hereinafter.

During record operation modes, a control signal, typically, at a rate of one-half the vertical television field rate, is received on line 187. The signal on line 187 is applied via the switch 186 and line 188 to the winding 183 of transducer 182. Consequently, the transducer 182 records that signal along track 184 on tape 80 simultaneously as information signals are recorded along the transversely extending tracks 97. The control signal on line 187 is applied at that time via switch 186 and line 189 to the servo circuit 191, which in turn controls the operation of the head wheel motor 76 to be synchronous with the signal on line 187. The synchronous condition is obtained by comparing the control signal to a signal received from a tachometer mechanism operatively coupled to the head wheel motor 76 via line 190 that is indicative of the rotational rate and position of the head wheel 74, hence, the transducing zone in the keeper 78. The servo circuit 191 responsively generates a correction signal that corrects deviations of the actual location of the head wheel 74, hence, the transducing zone, from the desired location indicated by the control signal on line 187.

During playback, the servo circuit 191 receives information related to the rotational rate and position of the head wheel 74, hence, the transducing zone in the keeper 78, received from the tachometer mechanism associated with the head wheel motor 76 via line 190. The servo circuit 191 compares the information received via line 190 to the control signal information reproduced by transducer 182 and received over line 189. In response to this comparison, correction signals are generated on lines 192 and 199. The line 192 couples the received signal to the the head wheel motor 76 to cause acceleration or deceleration of the rotation of the head wheel 74, hence scanning of the transducing zone along the width W of the keeper 28. The line 199 couples the received correction signal to the motor 194, which controls the capstan 193 to adjust correspondingly the transport of the tape 80. This control of the capstan 193 and head wheel 74 results in maintaining registration of the scanning transducing zone over the tracks 97 extending transversely along the tape 80. Such transducer-to-track registration control can be enhanced by use of a high resolution tachometer operatively linked to the capstan 193 that provides a high rate signal indicative of the speed of transport of the tape 143. This tachometer signal is coupled to the servo circuit 191 for comparison with the play reference signal provided over line 196. A resulting correction signal is generated which is provided over line 199 to the motor 194 for corresponding control of the capstan 193.

From the foregoing description, it will be appreciated that the apparatus FIG. 4 is suitable for recording and playing back signals along tracks extending transversely along a longitudinally moving medium that is in contact with an outer surface of a keeper. The rotating physical gaps that effect the formation and movement of a gapless transducing zone are out of contact with both the keeper and the medium and, therefore, such gaps are not exposed to wear or erosion. Wear of the transducer-keeper combination is reduced to that caused by a relatively slowly advancing medium in contact with an outer surface of a stationary, gap-less, smooth keeper.

FIG. 5 illustrates another wideband, high density signal record and reproduce apparatus embodiment of the present invention. While the head wheel of the embodiment FIG. 4 rotates in a plane substantially perpendicular to the longitudinal direction of tape movement, in the embodiment of FIG. 5, the head wheel rotates in a plane substantially parallel to the direction of tape movement. This arrangement may be particularly useful when it is desired to record substantially longer tracks on tape, such as produced by rotary helical scan and longitudinal tape record and reproduce apparatus. In conventional rotary helical scan apparatus, the tape is introduced to a helical path about a cylindrical tape guide drum from one side of the drum guide for scanning by a rotating transducer, and is wrapped around the drum so that it exists from another location about the circumference of the drum at a different position axially displaced along the drum surface relative to the entry position. Information signals are recorded in discrete parallel tracks that diagonally extend along the tape at an angle relative to the longitudinal direction of the tape, whereby a track length greatly in excess of the width of the tape can be achieved. For a given helical scan apparatus construction, the angular orientation of the recorded tracks is a function of both the velocity of transport of the tape about the tape guide drum, as well as the speed of rotation of the rotating transducer. The resultant angle, therefore, varies depending upon the relative velocities of both the rotating transducer and the transport of the tape. In most helical scan apparatus, the transducer is carried by the tape guide drum, which in turn is formed by two axially displaced cylindrical sections, one of which (usually the upper most) rotates while the other section remains stationary.

However, the apparatus of FIG. 5 significantly differs from a conventional rotary helical scan apparatus in that the physical gap provided in the transducer core does not contact the tape. Instead, the tape is in contact with a stationary keeper, which in this embodiment is arranged circumferentially around and spaced from a portion of the rotating head wheel to be out of contact with the rotating physical gaps of the transducer cores mounted in the wheel.

With further reference to FIG. 5, a rotating head wheel 162 is arranged coaxially with a stationary upper drum 160, both made of aluminum or other suitable nonmagnetic material. The head wheel 162 has one or more rear cores 20 rigidly attached thereto, and is mounted to a shaft that is rotated by a drive motor 199. A portion of that shaft is shown at 161 in FIG. 5. In the apparatus of FIG. 5, the cores 20 are attached to a lower surface of the head wheel 162, for example by epoxy. However, they may be mounted thereto in any other suitable manner, for example inserted in slots provided in the head wheel and held therein by screws or other fasteners. A stationary lower drum 164 of nonmagnetic material, such as aluminum, is arranged coaxially with the upper drum 160, and has the same diameter as the upper drum. The two drums are axially displaced from each other to define a space or slot 166 between the drums for the rotating rear cores 20. A keeper 167 of a magnetic material, for example permalloy, Sendust or amorphous metal, is arranged circumferentially around a portion of the periphery of drums 160, 164 and is firmly attached thereto, for example by screws. The thickness of the keeper is preferably selected within the range specified previously for the embodiment of FIG. 1. The keeper 167 is spaced from the rotating cores 20 in such a way that these cores rotate in close proximity to the keeper, but out of contact therewith. The core 20 shown in FIG. 5 has a common transducing signal and control winding 168, similar to the previously described winding 39 of FIG. 4.

A magnetic tape 176 is transported in a longitudinal direction 177 along a helical path extending around the stationary drums 160, 164, and in physical contact with the keeper 167. To assure a close contact with the keeper, the tape is guided under tension around the drums by rotating tape guides 190, 191.

A rotary transformer is arranged coaxially with the drum assembly and has a rotating upper portion 169 attached to the motor shaft 161 and a stationary lower portion 170. The winding 168 of each rotating rear core 20 is attached to the primary winding (not shown) provided on the rotating portion 169 of the rotary transformer. A capacitor 166 is coupled to isolate the signal processing circuits from the D.C. bias control circuits, as described with reference to the embodiments of FIGS. 2A and 4. During playback operation modes, the signal induced from the rotating primary windings into the stationary secondary windings (not shown) provided in the stationary portion 170 of the transformer is applied via line 126, switch 124 and amplifier 122 to the playback signal processor 118. In record operation modes, the signal to be recorded is applied from the record signal processor 116, via amplifier 120, switch 124 and lines 126 to the winding 168. The slip ring and brush assemblies 88 and 89 are similar to those previously described with reference to FIG. 4 and, therefore, their respective descriptions will not be repeated with reference to FIG. 5. The slip ring assembly 88 is joined to rotated with the motor shaft 161 by a shaft extension 174.

It will be understood from the previous description of the embodiment of FIG. 2B that when the apparatus of FIG. 4 or 5 is placed in a record operation mode, a separate flux bias-creating control current $I_c$ may be omitted, provided sufficient recording current is coupled to the signal winding to saturate the virtual gap or the transducing zone within the keeper 167.

While the apparatus of FIG. 5 is similar to the embodiment previously described with reference to FIG. 4, there is a difference in the way the tape 176 is transported in the direction 177 past the rotating head wheel 162. In the embodiment of FIG. 4, the gap 26 defined by the rotating rear core 20 scans the tape at an angle which is substantially perpendicular to the longitudinal dimension and direction of transport of the tape 80. However, in the embodiment of FIG. 5, the gap 26 scans the tape 176 at a selected angle, as shown at n, with respect to the longitudinal dimension and direction 177 of transport of the tape 176, which angle is selected in accordance with the desired length for the recorded tracks 175. As can be seen from FIG. 5, the embodiment of the present invention illustrated therein produces long tracks 175 of recorded information extending substantially longitudinal to the length of the tape 176 at a very small angle to the length.

From the foregoing description, it will be appreciated that, like the apparatus FIG. 4, the embodiment of FIG. 5 is suitable for recording and playback of signals along tracks extending substantially along the length of a moving tape that is in contact with an outer surface of a keeper, which does not have a physical gap therein. As described hereinbefore, this contact results in the establishment of a flux path between the tape 176 and winding 168 for signal information that is not wavelength dependent, which reduces the effects of spacing losses. Also, the rotating physical gaps that effect the formation and movement of a gap-less transducing zone are out of contact with both the keeper and the medium and, therefore, such gaps are not exposed to wear or erosion. Wear of the transducer-keeper combination is reduced to that caused by a relatively slowly advancing medium in contact with an outer surface of a stationary, gap-less, smooth keeper.

As has been described hereinbefore, forming a gapless transducing zone in the keeper by creating in the same one or more significant magnetic discontinuities, i.e., areas of substantially different magnetic permeability, such as typically are provided in electromagnetic transducers by the inclusion of a physical transducing gap offers several advantages not realizable with common magnetic transducers relying upon physical gaps to effect signal transfers relative to magnetic storage media. A permeability gradient provides such discontinuity and it is most desirable that there by a steep permeability gradient between the region of the body providing the transducing zone and adjacent regions. The nature of such gradient and a preferred embodiments achieving the same have been described in more detail hereinbefore. Such discontinuity is most simply provided in the body by having adjacent magnetically saturated and unsaturated regions. Moreover, a transducing zone can be easily generated and defined in the keeper through the cooperation of a physical gap in a conventional electromagnetic transducer and a source of magnetic bias flux.

FIG. 6 shows a permeability m versus flux density B characterisitc of a suitable magnetic material for fabrication of the keeper. As seen from that characteristic, the material has a large difference in permeability over a narrow range of flux densities. FIG. 7 illustrates the effect of saturating the keeper at a localized zone. From FIGS. 6 and 7, it is seen that it is desirable that the overall permeability versus flux density gradient be as sharp as possible in order to obtain well defined boundaries between the saturated region and the adjacent unsaturated regions of the tranducing zone 50 through which signal flux is coupled between a magnetic storage medium and a signal utilization device.

The reluctance provided by the keeper to the passage of magnetic flux along a path that shunts the transducer plays an important role in effecting the transfer of signals between the magnetic storage medium and a signal utilization device. This reluctance is selected relative to the reluctance for such flux along a path extending through the operatively associated transducer to assure a desired transmission of information. The relative reluctances are achieved through the selection of appropriate combinations of various characteristics, such as materials, thickness of materials, size of area of transducer pole faces, size of area of saturated keeper region in a plane perpendicular to the face of the transducer, thickness of the keeper, distance (if any) separating the transducer and the keeper of the record medium, and the length, width and depth, of air gap of the transducer.

While the invention has been shown and described with particular reference to various embodiments thereof, it will be understood that variations and modifications in form and details may be made therein without departing from the spirit and scope of the invention as defined in the appended claims.

What is claimed is:

1. A magnetic transducer, comprising:
   a magnetic core with poles defining a transducing gap therebetween;
   a keeper of magnetic material extending in close proximity of said magnetic core to bridge said transducing gap;
   means magnetically coupled to said magnetic core for providing a magnetic flux coupled from said core at said transducing gap to saturate a portion of said keeper in an area bridging said transducing gap to define a transducing region in said keeper; and
   means for moving said magnetic core in closely spaced relationship with respect to said keeper to thereby vary the location of said transducing region in said keeper.

2. The magnetic transducer of claim 1 wherein said keeper is stationary.

3. The magnetic transducer of claim 1 wherein said means coupled for providing said fringing flux comprises a winding engaging said magnetic core and coupled to receive a control current for providing a control flux.

4. The magnetic transducer of claim 3 wherein said winding is coupled to a DC voltage source.

5. The magnetic transducer of claim 3 wherein said winding is coupled to an AC voltage source.

6. The magnetic transducer of claim 1 wherein said means coupled for providing said fringing flux comprises a recording signal winding coupled to a source of recording current and engaging said magnetic core.

7. The magnetic transducer of claim 1 wherein said magnetic core has a substantially U-shape.

8. The magnetic transducer of claim 1 wherein said magnetic core is moveable in a direction of a length of said transducing gap.

9. The magnetic transducer of claim 8 wherein said keeper is a strip of magnetic material having a width at least equal to a width of said transducing gap.

10. The magnetic transducer of claim 1 wherein said magnetic core provides substantially parallel signal and control flux paths.

11. The magnetic transducer of claim 1 further comprising a magnetic front core attached to said keeper and forming a substantially closed magnetic circuit therewith and wherein said means for providing said fringing flux comprises a winding engaging said front core.

12. The magnetic transducer of claim 3 further comprising a magnetic front core attached to said keeper and forming a substantially closed magnetic circuit therewith, and a transducing signal winding associated with said front core for intercepting a transducing signal flux.

13. The magnetic transducer of claim 12 wherein said transducing signal flux extends in a path which is substantially perpendicular to a path provided by said control flux.

14. The magnetic transducer of claim 1 wherein said magnetic core is moveable in a reciprocating movement with respect to said keeper.

15. The magnetic transducer of claim 1 wherein said magnetic core is moveable in a rotational movement with respect to said keeper.

16. The magnetic transducer of claim 2 wherein said keeper comprises a cylindrical segment.

17. The magnetic transducer of claim 1 wherein said keeper has a thickness in a range between 0.00025 inch and 0.002 inch in a direction of a depth of said transducing gap.

18. The magnetic tranducer of claim 1 wherein said keeper is made of a soft magnetic material having a substantially square hysteresis loop.

19. The magnetic tranducer of claim 1 wherein said magnetic core comprises a back core having a substantially U-shape and defining said transducing gap, a front core attached to said keeper and forming a substantially closed magnetic circuit therewith, a control signal winding magnetically coupled with said back core and providing a control flux coupled from said core at said gap to saturate a portion of said keeper bridging the gap and a transducing signal winding coupled with said front core and wherein said back core, front core and keeper provide respective transducing and control flux paths extending perpendicular to each other.

20. The magnetic transducer of claim 1 wherein said magnetic core comprises a back core defining said transducing gap and a front core attached to said keeper and forming a substantially closed magnetic circuit therewith and a winding magnetically coupled with said front core for providing a control flux that is coupled from said magnetic core at said transducing gap and saturating said portion of the keeper and for intercepting a transducing signal flux.

21. Apparatus for transferring magnetically defined information to and/or from a magnetic medium, comprising:
   a magnetic transducer having a moveable core with poles defining a transducing gap therebetween;
   a stationary keeper extending in closely spaced relationship with said magnetic core and bridging said transducing gap;
   means magnetically coupled to said magnetic core for providing a magnetic flux fringing from said transducing gap to saturate a portion of said keeper bridging said transducing gap to provide a transducing region in said keeper; and
   means for moving said moveable core with respect to said stationary keeper and out of contact therewith, to move said saturated transducing region in said keeper.

22. The apparatus of claim 21 further comprising means for advancing a magnetic medium past said stationary keeper and in direct contact therewith.

23. The apparatus of claim 22 further comprising means for applying a current to said means coupled to said core for providing said fringing flux.

24. The apparatus of claim 23 further comprising means for synchronizing said means for moving said moveable core with said means for advancing said medium.

25. The apparatus of claim 21 wherein said means for moving is coupled to provide a linear reciprocating movement of said moveable core with respect to said stationary keeper.

26. The apparatus of claim 25 wherein said transducing gap of said moveable core has a length substantially in the direction of said reciprocating movement.

27. The apparatus of claim 21 wherein said means for moving is coupled to provide a rotational movement with respect to said stationary keeper.

28. The apparatus of claim 27 wherein said transducing gap of said moveable core has a length substantially in a tangential direction with respect to said rotational movement.

29. Apparatus for transferring magnetically defined information to and/or from a magnetic medium, comprising:
   a rotatable head wheel having a magnetic transducer core mounted at a periphery thereof, said transducer core having confronting poles defining a transducing gap therebetween, said transducing gap projecting from said head wheel;
   a stationary keeper mounted in a closely spaced relationship with the periphery of said rotatable head wheel to magnetically bridge said transducing gap during rotation of the transducer core by said head wheel; and
   means magnetically coupled to said transducer core during rotation of said head wheel for providing a magnetic flux fringing from said transducing gap and saturating a portion of said keeper bridging said transducing gap to provide a moving transducing region in said keeper.

30. The apparatus of claim 29 further comprising means for advancing a magnetic tape past said stationary keeper and in contact therewith.

31. The apparatus of claim 30 wherein said transducing gap has a length extending tangentially to a direction of rotation of said head wheel.

32. The apparatus of claim 31 wherein said magnetic tape is transported in a direction substantially perpendicular to said transducing gap length.

33. The apparatus of claim 31 wherein said magnetic tape is transported in a direction oblique to said transducing gap length.

34. The apparatus of claim 29 wherein said transducer further comprises:
   a front core attached to said keeper and forming a substantially closed magnetic circuit therewith
   a transducing signal winding magnetically coupled to said front core for intercepting a signal flux extending in said keeper and fringing said saturated region therein and wherein
   said signal flux extends in a path substantially perpendicular to a path provided by said flux saturating said portion of said keeper.

35. The apparatus of claim 29 wherein said head wheel has a plurality of said transducer cores mounted around a periphery thereof.

36. The apparatus of claim 29 wherein said means coupled said transducer core is coupled to receive a control current to provide a control flux for saturating said portion of the keeper.

37. The apparatus of claim 29 wherein said means coupled to said transducer core is a winding coupled to receive a recording signal current to provide a recording signal flux for saturating said portion of the keeper.

38. The apparatus of claim 29 further comprising means for advancing said magnetic medium in close proximity of said stationary keeper.

39. Apparatus for transferring information to and/or from a magnetic medium, comprising:
   a rotatable head wheel having at least one transducer core mounted at a periphery thereof, said transducer core having confronting poles defining a transducing gap therebetween, said transducing gap projecting from said head wheel and having a length extending tangentially to a direction of rotation of said head wheel;
   stationary keeper means rigidly mounted in a closely spaced relationship with the periphery of said rotatable head wheel to magnetically bridge said transducing gap during rotation of the transducer core by the head wheel;
   winding means magnetically coupled with said rotatable transducer core for inducing a flux in said transducer core that is coupled into said keeper for saturating a portion of said keeper bridging said transducing gap; and
   means for advancing said magnetic medium in a direction substantially perpendicular to a plane of rotation of said head wheel and in direct contact with said keeper.

40. The apparatus of claim 39 further comprising a magnetic front core attached to said keeper and forming a substantially closed magnetic circuit therewith and a transducing signal winding magnetically coupled with said front core for intercepting a transducing signal flux extending in said keeper and fringing said saturated portion of said keeper.

41. Apparatus for transferring magnetically defined information to and/or from a magnetic tape comprising:
a stationary upper drum;
a stationary lower drum arranged coaxially with said upper drum and spaced therefrom;
a rotatable head wheel arranged coaxially between said drums;
said head wheel having at least one transducer core mounted at a periphery thereof, said transducer core having confronting poles defining a transducing gap therebetween, said transducing gap projecting from said head wheel and having a length extending tangentially to a direction of rotation of said head wheel;
a stationary keeper rigidly mounted in closely spaced relationship with the periphery of said rotatable head wheel to magnetically bridge said transducing gap during rotation of the transducer core by the head wheel;
a winding magnetically coupled to said transducer core and connected to a source of current to induce a flux in said transducer core that fringes from said gap for saturating a portion of said keeper bridging said transducing gap; and
means for advancing said magnetic tape at a selected angle to a plane of rotation of said head wheel and in direct contact with said stationary keeper.

42. The apparatus of claim 41 wherein said keeper is snuggly wrapped around said stationary drums, said apparatus further comprising guiding means for guiding said magnetic tape around said stationary drums at a selected angle with respect to a plane of rotation of said head wheel and in direct contact with said stationary keeper.

43. The apparatus of claim 41 wherein said keeper is snuggly wrapped around said stationary drums, said apparatus further comprising guiding means for guiding said magnetic tape around said stationary drums in a longitudinal direction tangentially to said direction of rotation of the head wheel and in direct contact with said keeper.

44. A method of transferring magnetically defined information between a magnetic medium and a transducer of the type including a magnetic core having complementary poles defining a transducing gap therebetween and a keeper of a thin magnetic material that is arranged in close proximity of said magnetic core while bridging said transducing gap, comprising the steps of:
applying to said transducer core a magnetic flux that fringes from said transducing gap to saturate a portion of said keeper which bridges said gap, to form a transducing region in said keeper,
moving said magnetic core in a closely spaced relationship with respect to said keeper while maintaining the keeper stationary, to move said transducing region therein, and
providing a signal flux extending between said magnetic medium and said keeper and fringing said transducing region in said keeper.

45. A method of recording a signal on a magnetic medium with a transducer of the type including a magnetic core having complementary poles defining a transducing gap therebetween and a keeper of a thin magnetic material arranged in close proximity of said magnetic core to bridge said transducing gap; comprising the steps of:
applying to said transducer core a recording signal flux that fringes from said transducing gap, said flux having a sufficient magnitude to saturate a portion of said keeper which bridges said gap, to form a transducing region in said keeper;
moving said magnetic core in a closely spaced relationship with respect to said keeper while maintaining the keeper stationary, to move said transducing region therein; and
advancing said magnetic medium in close proximity to said keeper.

46. A method of playing back a signal recorded on a magnetic medium with a transducer of the type including a magnetic core having complementary poles defining a transducing gap therebetween and a keeper of a thin magnetic material arranged in close proximity of said magnetic core to bridge said transducing gap; comprising the steps of:
applying to said transducer core a control flux that is coupled from said core to said keeper to saturate a portion of said keeper which bridges said gap, to form a transducing region in said keeper;
moving said magnetic core in a closely spaced relationship with respect to said keeper while maintaining the keeper stationary, to move said transducing region therein; and
advancing said magnetic medium with said signal recorded thereon in close proximity of said keeper.

47. A method of transferring magnetically defined information between a magnetic tape and a transducer of the type including at least one magnetic core having complementary magnetic poles defining a transducing gap therebetween, a rotatable head wheel having said magnetic core attached thereto with said transducing gap being arranged at a periphery of said head wheel, and a stationary keeper of a thin magnetic material arranged in a closely spaced relationship with said magnetic core to bridge said transducing gap during rotation of the core by the head wheel; comprising the steps of:
applying a magnetic flux to said magnetic core to saturate a region of said keeper bridging said gap to obtain a moving transducing region in said keeper;
transporting said magnetic tape in contact with said keeper and at a selected angle with respect to a direction of rotation of said head wheel; and
providing a signal flux extending between said magnetic tape and said keeper and fringing said transducing region in said keeper.

48. A magnetic transducer, comprising:
a magnetic core with poles defining a transducing gap therebetween;
a body of magnetic material extending in close proximity to said magnetic core to bridge said transducing gap;
means magnetically coupled to said magnetic core for providing a magnetic flux which flows in said body with different amounts of flux in different portions of said body to thereby define a region in said body which establishes an area through which magnetic flux is transferred to or from said body; and means for moving said magnetic core relative to said body to thereby vary the location of said region along said body.

49. A method for transferring magnetically defined information between a magnetic recording medium and a magnetic transducer of the type including a magnetic core having a transducing gap and a body of thin magnetic material in close proximity to the magnetic core so as to bridge said gap; comprising the steps of:

advancing said magnetic recording medium in close proximity to said body of magnetic material;

generating a control flux in said magnetic core which flows in said body with different amounts of flux in different portions of said body to thereby define a region in said body which establishes an area through which magnetic flux flows between said body and said recording medium; and moving said magnetic core relative to said body to thereby vary the location of said region along said body.

* * * * *